United States Patent
Fugazza et al.

(10) Patent No.: US 12,153,823 B2
(45) Date of Patent: Nov. 26, 2024

(54) MULTI-LEVEL MEMORY PROGRAMMING AND READOUT

(71) Applicant: Intel Corporation, Santa Clara, CA (US)

(72) Inventors: Davide Fugazza, San Jose, CA (US); Dany-Sebastien Ly-Gagnon, Santa Clara, CA (US); DerChang Kau, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 865 days.

(21) Appl. No.: 17/068,369

(22) Filed: Oct. 12, 2020

(65) Prior Publication Data

US 2022/0113892 A1   Apr. 14, 2022

(51) Int. Cl.
| | |
|---|---|
| *G11C 11/56* | (2006.01) |
| *G06F 3/06* | (2006.01) |
| *G11C 13/00* | (2006.01) |
| *H10N 70/00* | (2023.01) |

(52) U.S. Cl.
CPC .......... *G06F 3/0655* (2013.01); *G06F 3/0604* (2013.01); *G06F 3/0679* (2013.01); *G11C 11/5678* (2013.01); *G11C 13/003* (2013.01); *G11C 13/004* (2013.01); *G11C 13/0069* (2013.01); *G11C 13/0026* (2013.01); *G11C 13/0028* (2013.01); *G11C 2013/0078* (2013.01); *H10N 70/826* (2023.02); *H10N 70/882* (2023.02)

(58) Field of Classification Search
CPC .... G06F 3/0655; G06F 3/0604; G06F 3/0679; G11C 11/5678; G11C 13/003; G11C 13/004; G11C 13/0069; G11C 13/0026; G11C 13/0028; G11C 2013/0078; G11C 11/5628; G11C 11/5642; H10N 70/826; H10N 70/882; H10B 63/24; H10B 63/84
See application file for complete search history.

(56) References Cited

U.S. PATENT DOCUMENTS

| | | | |
|---|---|---|---|
| 2010/0182827 A1* | 7/2010 | Kostylev | G11C 13/0004 365/163 |
| 2010/0284211 A1* | 11/2010 | Hennessey | G11C 11/5678 365/163 |
| 2013/0301334 A1 | 11/2013 | Spessot et al. | |
| 2014/0063898 A1 | 3/2014 | Fantini et al. | |
| 2016/0133671 A1 | 5/2016 | Fantini et al. | |
| 2016/0284404 A1 | 9/2016 | Rangan et al. | |
| 2017/0263317 A1* | 9/2017 | Kim | G11C 13/0064 |
| 2018/0088978 A1* | 3/2018 | Li | G06F 9/45558 |
| 2019/0043576 A1 | 2/2019 | Banerjee et al. | |
| 2019/0043580 A1 | 2/2019 | Pirovano et al. | |

(Continued)

*Primary Examiner* — Jay W. Radke
(74) *Attorney, Agent, or Firm* — Alliance IP, LLC

(57) ABSTRACT

A memory device including a three dimensional crosspoint memory array comprising memory cells each comprising two terminals and a storage element programmable to one of a plurality of program states each representing distinct values for at least two bits; and access circuitry to apply a first program pulse with a positive polarity across the two terminals of a first memory cell of the memory cells to program the first memory cell to a first program state of the program states; and apply a second program pulse with a negative polarity across the two terminals of the first memory cell to program the first memory cell to a second program state of the program states.

21 Claims, 12 Drawing Sheets

(56) References Cited

U.S. PATENT DOCUMENTS

| | | |
|---|---|---|
| 2019/0081103 A1 | 3/2019 | Fantini et al. |
| 2019/0102099 A1 | 4/2019 | Banerjee et al. |
| 2019/0206506 A1* | 7/2019 | Tortorelli ............. H10N 70/231 |
| 2019/0324671 A1 | 10/2019 | Banerjee et al. |
| 2019/0348114 A1 | 11/2019 | Banerjee et al. |
| 2019/0362789 A1 | 11/2019 | Tortorelli et al. |
| 2020/0335551 A1* | 10/2020 | Tortorelli ........... H10N 70/8825 |
| 2021/0312976 A1* | 10/2021 | Pellizzer ........... G11C 11/40615 |
| 2022/0013167 A1* | 1/2022 | Robustelli ............ G11C 7/1051 |
| 2022/0013183 A1* | 1/2022 | Sarpatwari ......... G11C 16/3404 |

\* cited by examiner

MULTI-LEVEL MEMORY PROGRAMMING AND READOUT

FIELD

The present disclosure relates in general to the field of computer development, and more specifically, to memory devices for multi-level memory programming and readout.

BACKGROUND

A storage device may include non-volatile memory, such as multi-stack 3D crosspoint memory arrays. Memory cells of the memory arrays may be programmed via wordlines and bitlines of the memory array.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
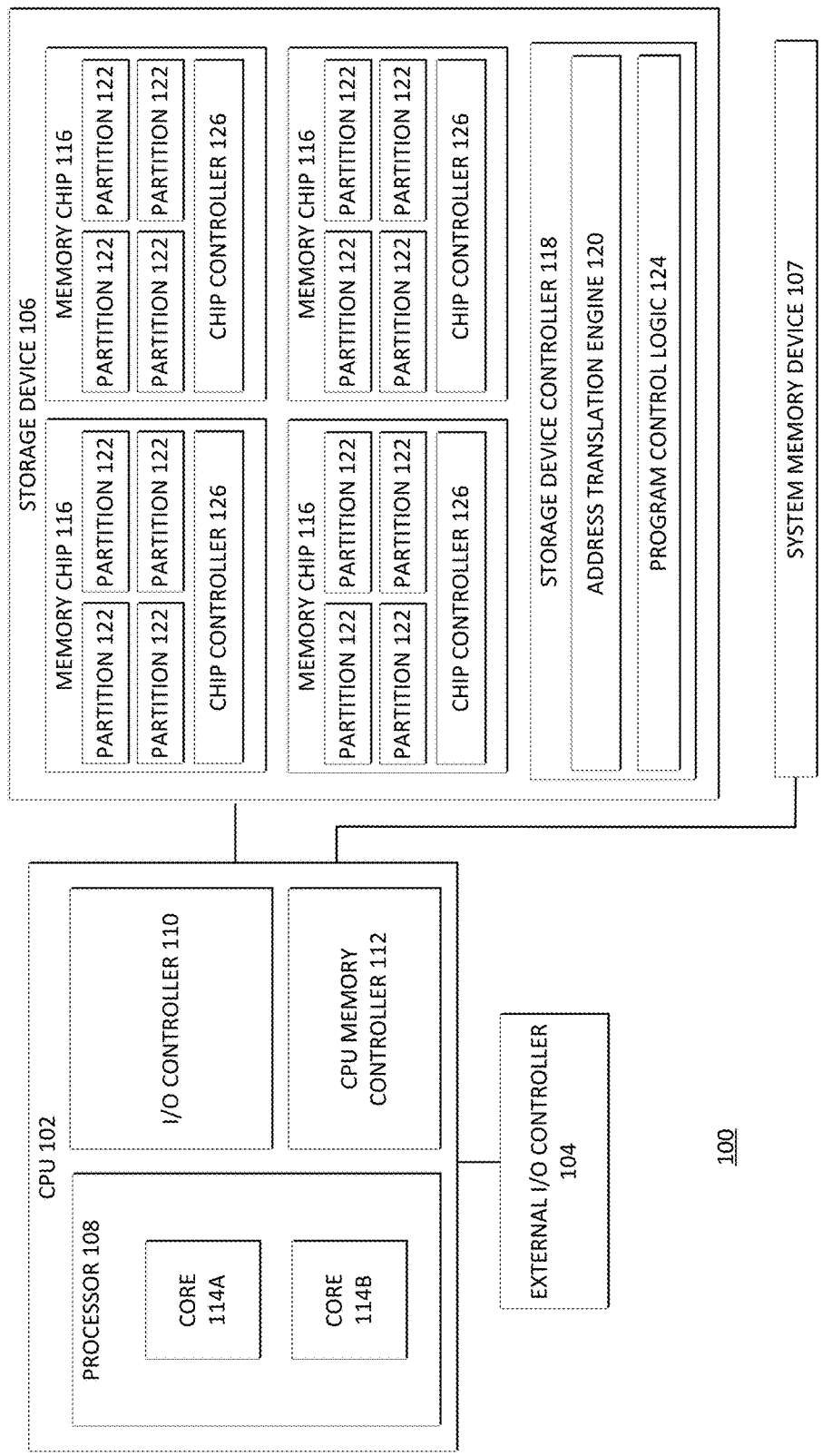
FIG. 1 illustrates components of a computer system in accordance with certain embodiments.

FIG. 1 illustrates components of a computer system 100 in accordance with certain embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

Various approaches, such as multi-deck arrays and cell area scaling, have been utilized to increase 3D crosspoint memory density. Density improvement via multi-level cell memories (where a memory cell stores more than a single bit) has been explored, but production of a viable multi-level cell 3D crosspoint memory array has been hampered by a limited read window budget, unsatisfactory program state retention (read margin closure over time requiring frequent refresh), and read and write disturb (unwanted distributional 'shift' during demarcation read) issues, hence requiring demanding refresh approaches affecting overall performance.

In particular embodiments of the present disclosure, 3D crosspoint memory arrays with multi-level cells having adequate program windows are provided. In various embodiments, the arrays may be programmed using either unipolar and/or bipolar program pulses. The memory cells may exhibit program windows within given write-read quadrant(s). A write-read quadrant may be defined as a combination of write and read polarities: combinations may be positive-positive, negative-positive, positive-negative, or negative-negative, for write and read polarities, respectively. In unipolar memory operation, read and write polarity are the same, while in bipolar memory operation the write polarity may change for given read polarity (and vice versa). The memory cells program window may be tunable by varying write current (e.g. 1-60 $MA/cm^2$) and/or write pulse-width (e.g., 1-1000 nanoseconds). The achievable program window within a given write-read quadrant may be relatively large (e.g., greater than 100 mV or even greater than hundreds of mV) and sufficient for demarcation read of distributions across cells within the cross-point array. Various embodiments introduce a read algorithm featuring controllable current and polarity for disturb-immune, refresh-embedded readout. The algorithm may be used in a single polarity (unipolar) or a double polarity (bipolar) memory operation, in which the memory cells store more than a single bit per cell. Various embodiments may provide algorithmic simplicity for analog tuning within, e.g., a single element stack; process integration; or a relatively large selector device window (e.g., through engineered alloys).

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI. Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. Nonlimiting examples of nonvolatile memory may include any or a combination of: 3D crosspoint memory, phase change memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a disk drive (e.g., a solid state drive); a memory card; a Universal Serial Bus (USB) drive; a Dual In-line Memory Module (DIMM), such as a Non-Volatile DIMM (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
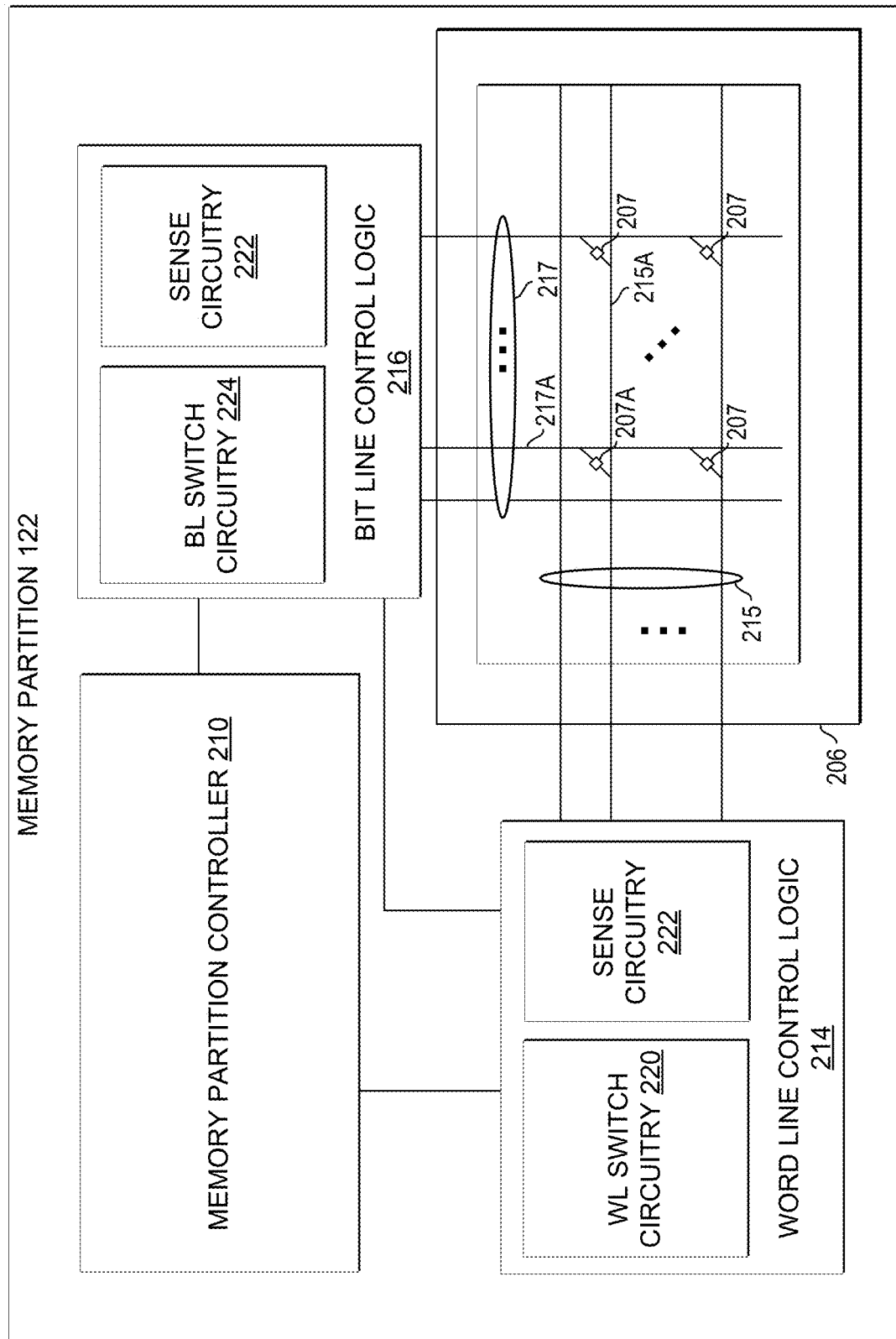
FIG. 2 illustrates a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called wordlines (WLs) and bitlines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a wordline may cross over a bitline located beneath the wordline and another bitline for another memory cell located above the wordline. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell.

FIG. 2 illustrates a memory partition in accordance with certain embodiments. In the embodiment of FIG. 2, a memory partition 122 includes memory partition controller 210, wordline control logic 214, bitline control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with wordline control logic 214 and bitline control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of wordlines 215, a plurality of bitlines 217 and a plurality of memory cells, e.g., memory cells 207. Each memory cell is coupled between a wordline ("WL") and a bitline ("BL") at a crosspoint of the WL and the BL.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage (e.g., a neutral bias voltage) to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage (e.g., a neutral bias voltage) to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read voltage VDM. VDM may induce a current (icell) in the memory cell 207A dependent on a program state of the memory cell. A comparator such as a sense amplifier may compare icell with a reference current in order to read a logic state of the memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, in one embodiment, 128 memory cells may be sensed at one time by sense amplifiers of the sense circuitry 222.

Figure 3:
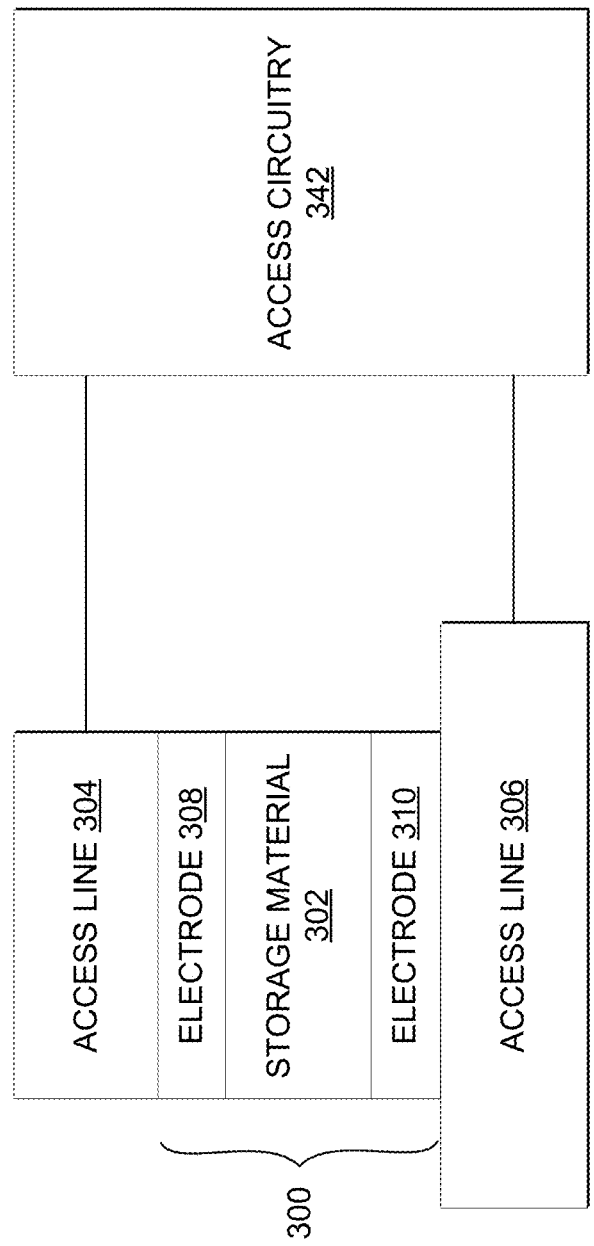
FIG. 3 illustrates a memory cell coupled to access circuitry in accordance with certain embodiments.

FIG. 3 illustrates a memory cell 300 coupled to access circuitry 342 in accordance with certain embodiments. The memory cell 300 includes a storage material 302 between access lines 304 and 306. The access lines 304, 306 electrically couple the memory cell 300 with access circuitry 342 that writes to and reads the memory cell 300. For example, access circuitry 342 may include WL switch circuitry 220, BL switch circuitry 224, sense circuitry 222, or other suitable circuitry.

In one embodiment, storage material 302 includes a self-selecting material that exhibits memory effects. A self-selecting material is a material that enables selection of a memory cell in an array without requiring a separate selector element. Thus, storage material 302 may represent a "selector/storage material." A material exhibits memory effects if circuitry (e.g., 342) for accessing memory cells can cause the material to be in one of multiple states (e.g., via a write operation) and later determine the programmed state (e.g., via a read operation). Access circuitry 342 can store information in the memory cell 300 by causing the storage material 302 to be in a particular state. The storage material 302 can include, for example, a chalcogenide material or other material capable of functioning as both a storage element and a selector, to enable addressing a specific memory cell and determining what the state of the memory cell is. Thus, in one embodiment, the memory cell 300 is a self-selecting memory cell that includes a single layer of material that acts as both a selector element to select the memory cell and a memory element to store a logic state. In the embodiment depicted, each memory cell 300 is a two-terminal device (i.e., the memory cell 300 has two electrodes to receive control signals sufficient to write to and read from the memory cell 300).

In other embodiments, each memory cell (e.g., 300) includes a memory element configured to store information and a separate memory cell select device (e.g., selector) coupled to the memory element. Select devices may include ovonic threshold switches, diodes, bipolar junction transistors, field-effect transistors, etc. In one embodiment, a first chalcogenide layer may comprise the memory element and a second chalcogenide layer may comprise the select device.

The storage material 302 may include any suitable material programmable to a plurality of states. In some embodiments, the storage material 302 may include a chalcogenide material comprising a chemical compound with at least one chalcogen ion, that is, an element from group 16 of the periodic table. For example, the storage material 302 may include one or more of: sulfur (S), selenium (Se), or tellurium (Te). Additionally or alternatively, in various embodiments, storage material 302 may comprise germanium (Ge), antimony (Sb), bismuth (Bi), lead (Pb), tin (Sn), indium (In), silver (Ag), arsenic (As), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta), or other materials. In various examples, the storage material 302 may include one or more chalcogenide materials such as such as Te—Se, Ge—Te, In—Se, Sb—Te, Ta—Sb—Te, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, or Se—As—Ge—Si—In. In other various examples, storage material 302 may include other materials capable of being programmed to one of multiple states, such as Ge—Sb, Ga—Sb, In—Sb, Sn—Sb—Bi, or In—Sb—Ge. One or more elements in a chalcogenide material (or other material used as storage material 302) may be dopants. For example, the storage material 302 may include dopants such as: aluminum (Al), oxygen (O), nitrogen (N), silicon (Si), carbon (C), boron (B), zirconium (Zr), hafnium (Hf), or a combination thereof. In some embodiments, the chalcogenide material (or other material used as storage material 302) may include additional elements such as hydrogen (H), oxygen (O), nitrogen (N), chlorine (Cl), or fluorine (F), each in atomic or molecular forms. The storage material 302 may include other materials or dopants not explicitly listed. In some examples, the storage material (such as any of the materials described above) is a phase change material. In other examples, the storage material 302 is not a phase change material, e.g., can be in one or multiple stable states (or transition between stable states) without a change in phase.

In some embodiments, a selector element coupled to storage material (e.g., in non-self-selecting memory cells) may also include a chalcogenide material. A selector device having a chalcogenide material can sometimes be referred to as an Ovonic Threshold Switch (OTS). An OTS may include a chalcogenide composition including any one of the chalcogenide alloy systems described above for the storage element and may further include an element that can suppress crystallization, such as arsenic (As), nitrogen (N), or carbon (C), to name a few. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

In some embodiments, an element from column III of the periodic table ("Group III element") may be introduced into a chalcogenide material composition to limit the presence of another material (e.g., Ge) in the selector device. For example, a Group III element may replace some or all of the other material (e.g., Ge) in the composition of the selector device. In some embodiments, a Group III element may form a stable, Group III element-centered tetrahedral bond structure with other elements (e.g., Se, As, and/or Si). Incorporating a Group III element into the chalcogenide material composition may stabilize the selector device to allow for technology scaling and increased cross point technology development (e.g., three-dimensional cross point architectures, RAM deployments, storage deployments, or the like).

In one embodiment, each selector device comprises a chalcogenide material having a composition of Se, As, and at least one of B, Al, Ga, In, and Tl. In some cases, the composition of the chalcogenide material comprises Ge or Si, or both.

In one example, the storage material is capable of switching between two or more stable states without changing phase (in other examples the storage material may switch between two stable states by changing phase). In one such embodiment, the access circuitry 342 programs the memory cell 300 by applying one or more program pulses (e.g., voltage or current pulses) with a particular polarity to cause the storage material 302 to be in the desired stable state. In one embodiment, the access circuitry 342 applies program pulses to the access lines 304, 306 (which may correspond to a bitline and a wordline) to write to or read the memory cell 300. In one embodiment, to write to the memory cell 300, the access circuitry applies one or more program pulses with particular magnitudes, polarities, and pulse widths to the access lines 304, 306 to program the memory cell 300 to the desired stable state, which can both select memory cell 300 and program memory cell 300. In various embodiments below, programming states are depicted as being associated with a single programming pulse, however, the single programming pulse may also be equivalent to a series of programming pulses that have the effective characteristics of the single programming pulse (e.g., a width of the single programming pulse may be equivalent to the sum of the widths of a series of shorter programming pulses).

In one embodiment, programming the memory cell 300 causes the memory cell 300 to "threshold" or undergo a "threshold event." When a memory cell thresholds (e.g., during application of a program pulse), the memory cell undergoes a physical change that causes the memory cell to exhibit a certain threshold voltage to be detected in response to the application of a subsequent voltage (e.g., through application of a read pulse with a particular voltage magnitude and polarity). Programming the memory cell 300 can therefore involve applying a program pulse of a given polarity to induce a programming threshold event and application of current for a duration of time, which causes the memory cell 300 to exhibit a particular threshold voltage at a subsequent reading voltage of a same or different polarity. In one such embodiment, the storage material 302 is a self-selecting material that can be programmed by inducing a threshold event.

During a read operation, access circuitry 342 may determine a threshold voltage of a memory cell based on electrical responses to a read voltage applied to the memory cell. Detecting electrical responses can include, for example, detecting a voltage drop (e.g., a threshold voltage) across terminals of a given memory cell of the array or current through the given memory cell. In some cases, detecting a threshold voltage for a memory cell can include determining that the cell's threshold voltage is lower than or higher than a reference voltage, for example a read voltage. The access circuitry 342 can determine the logic state of the memory cell 300 based on the electrical response of the memory cell to the read voltage pulse.

As mentioned above, the access lines 304, 306 electrically couple the memory cell 300 with circuitry 342. The access lines 304, 306 can be referred to as a bitline and wordline, respectively. The wordline is for accessing a particular word in a memory array and the bitline is for accessing a particular bit in the word. The access lines 304, 306 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 308 are disposed between storage material 302 and access lines 304, 306. Electrodes 308 electrically couple access lines 304, 306 to storage material 302. Electrodes 308 can be composed of one or more conductive and/or semiconductive materials such as, for example: carbon (C), carbon nitride ($C_xN_y$); n-doped polysilicon and p-doped polysilicon; metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include any suitable metal including, for example, metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

The memory cell 300 is one example of a memory cell that may be used as a multi-level cell (storing more than a single logical bit). Other embodiments can include memory cells having additional or different layers of material than illustrated in FIG. 3 (e.g., a selection device between the access line 304 and the storage element, a thin dielectric material between the storage material and access lines, or other suitable configuration).

Figure 4:
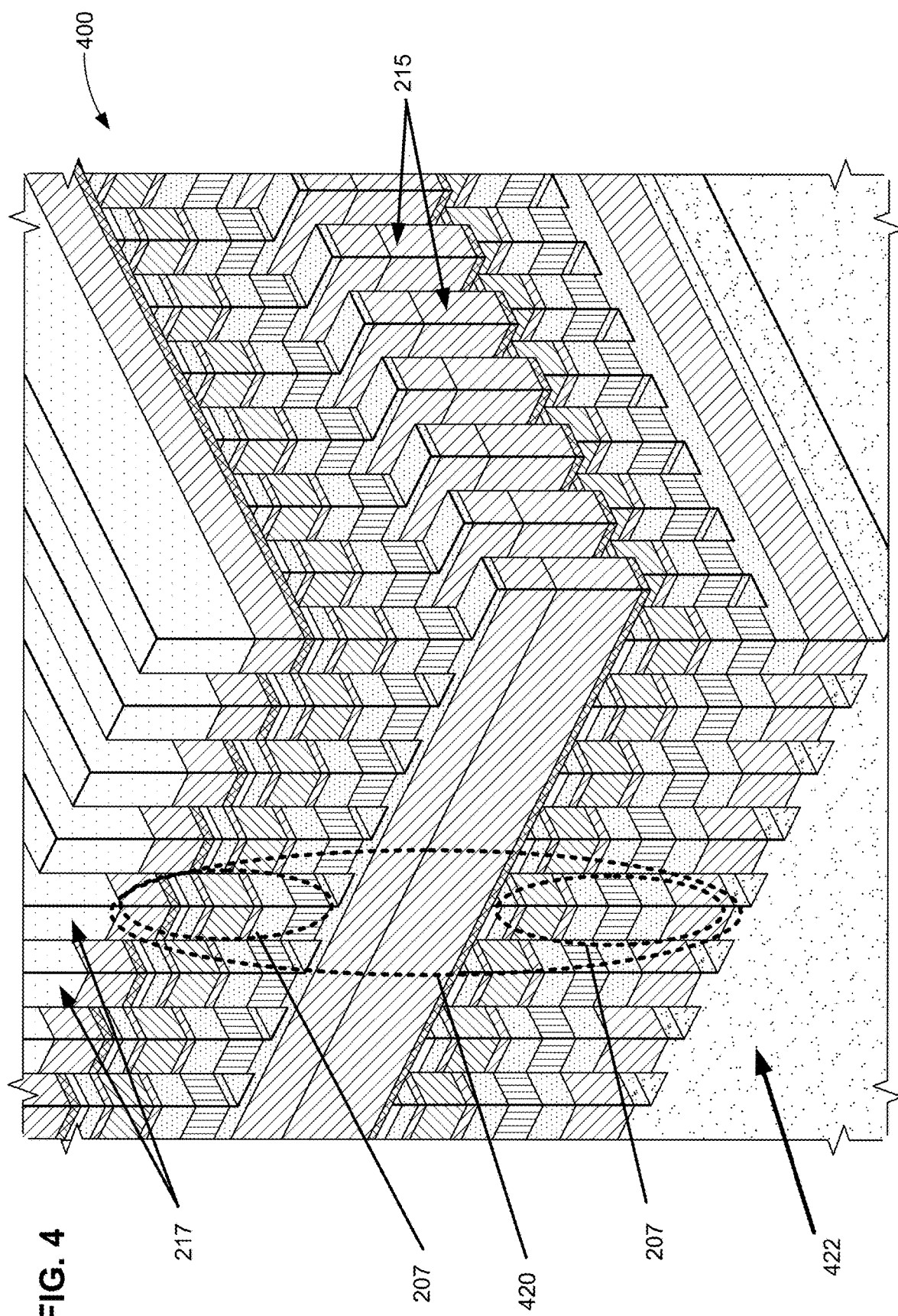
FIG. 4 is a perspective view of portions of a three dimensional (3D) crosspoint memory stack according to one embodiment.

FIG. 4 is a perspective view of portions of a 3D crosspoint memory stack according to one embodiment. The specific layers are merely examples and will not be described in detail here. Stack 400 is built on substrate structure 422, such as silicon or other semiconductor. Stack 400 includes multiple pillars 420 as memory cell stacks of memory cells 207 or 300. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. Different architectures can use different numbers of stacks of devices, and different configuration of WLs and BLs. It will be understood that the space between pillars 420 is typically an insulator.

Substrate structure 422, such as a silicon substrate, may include control circuitry therein (not shown), such as control circuitry including transistors, row decoders, page buffers, etc. The control circuitry of substrate structure 422 may include, for example, a memory partition controller such as memory partition controller 210, BL control logic such as BL control logic 216, and WL control logic such as WL control logic 214 of FIG. 2, access circuitry 342, or other suitable control circuitry. Each row of WLs 215 extending in the Y direction, the corresponding cells as coupled to corresponding BLs, would define a memory array, and may correspond to a memory array such as memory array 206 of FIG. 2.

Figure 5:
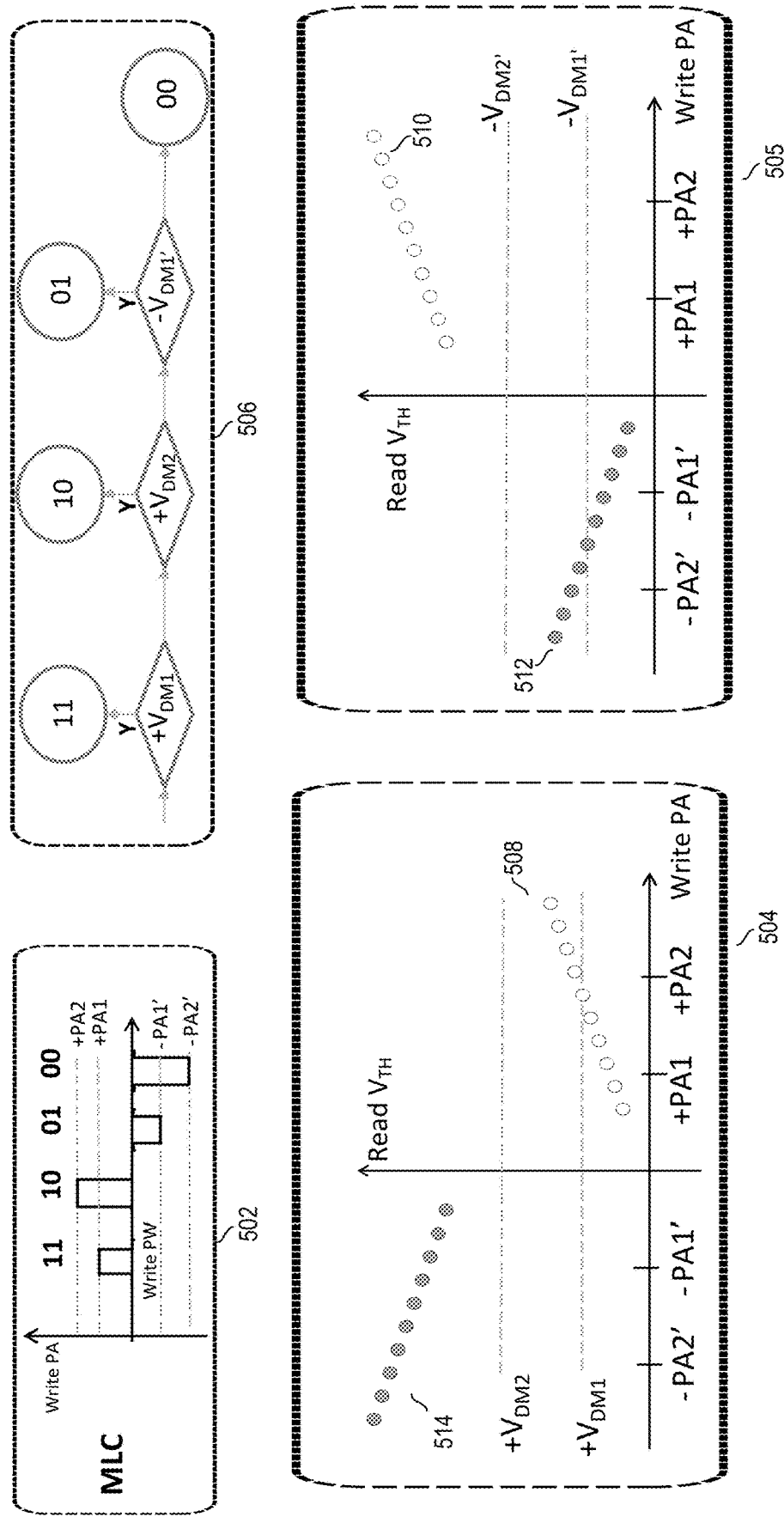
FIG. 5 illustrates program and read characteristics of a multi-level memory cell programmable using differing pulse amplitudes in a bipolar nature in accordance with certain embodiments.

FIG. 5 illustrates program and read characteristics of a multi-level memory cell programmable using differing pulse amplitudes in a bipolar nature in accordance with certain embodiments. FIG. 5 illustrates a program response diagram 502, a first write-read graph 504, a second write-read graph 505, and a read flow 506. In the discussion below, the amplitude or magnitude of a pulse may refer to either (or both) of the voltage of the pulse or the current of the pulse.

Program response diagram 502 illustrates four program pulses and resulting respective memory cell program states. As depicted, a first program pulse with a pulse amplitude (e.g., a voltage and/or a current amplitude) of +PA1 results in a program state of 11, a second program pulse with a pulse amplitude of +PA2 results in a program stateof 10, a third program pulse with a pulse amplitude of −PA1' results in a program state of 01, and a fourth program pulse with a pulse amplitude of −PA2' results in a program state of 00. The notation "+" and "−" before the pulse amplitude denotes the polarity, that is, "positive" and "negative", respectively. The pulse widths are all the same in this embodiment. The program states are arbitrary and could be assigned differently in other embodiments.

Figure 6:
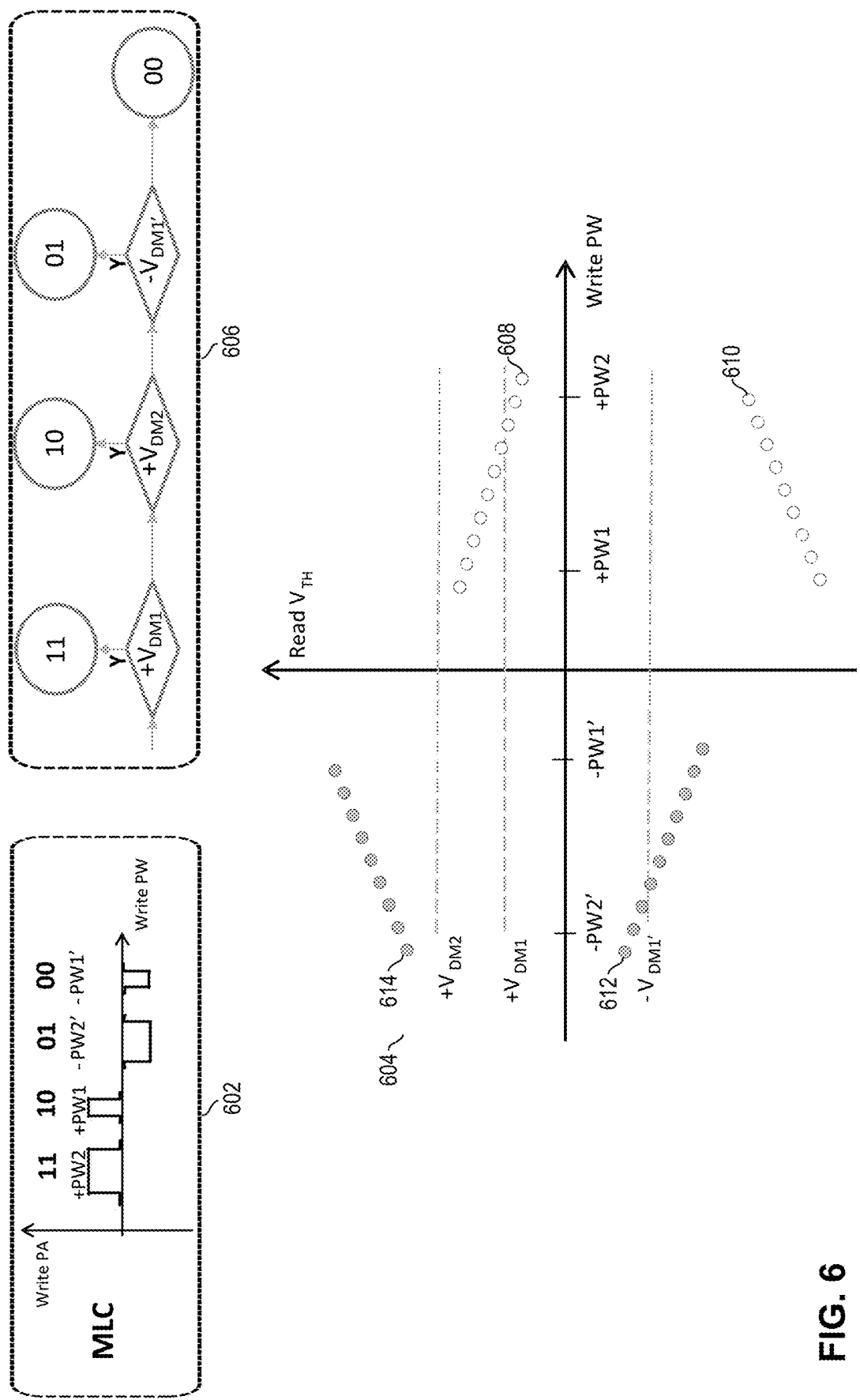
FIG. 6 illustrates program and read characteristics of a multi-level memory cell programmable using differing pulse widths in a bipolar nature in accordance with certain embodiments.
Figure 11:
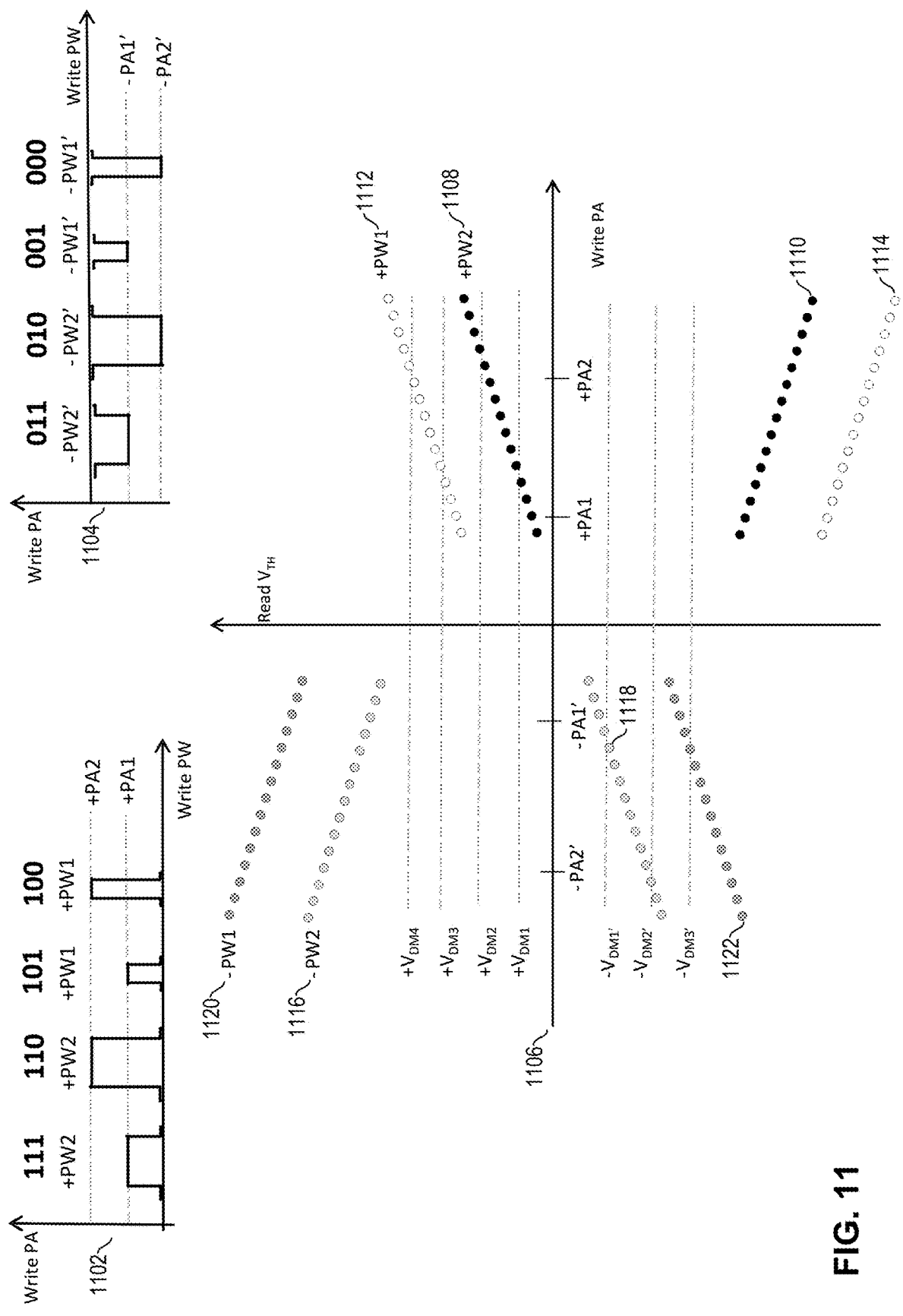
FIG. 11 illustrates program characteristics of a memory cell having eight programmable states in accordance with certain embodiments.

Whether or not a program pulse applied to a memory cell programs the cell to the desired state may depend upon the polarity, magnitude, and duration of the applied program pulse. In FIG. 5, the different states are programmed by varying the magnitude and polarity of the program pulses while maintaining the same pulse width across the different pulses. FIG. 6 illustrates different states that may be programmed by varying the pulse width and polarity of the program pulses while maintaining the magnitude of the pulses. FIG. 11 illustrates different states that may be programmed by varying the magnitude, pulse width, and polarity of the program pulses.

The duration of a program pulse can vary depending on implementation, and can be, for example, somewhere between 1 nanosecond and 1 microsecond. The program pulses can have a variety of shapes. In the example illustrated in FIG. 5, the program pulses are shown as box-shaped pulses (also known as rectangular-shaped or square-shaped pulses). In actual implementations, the program pulses may have leading or trailing edges. In some cases, the actual pulse shape may be the shape resulting from a discharge of transient current as governed by memory array and circuit parasitics. Other examples can apply program pulses having shapes such as triangular (e.g., ramped pulses), trapezoidal, rectangular, box, and/or sinusoidal shapes. Thus, circuitry for accessing memory cells can apply programming pulses having a variety of shapes and durations sufficient to cause the memory cells to threshold into the desired state.

As alluded to above, access circuitry (such as the access circuitry 342 referred to in FIG. 3) can write to or read a memory cell 300 by applying one or more pulses having a particular magnitude, pulse width, and polarity to the terminals (e.g., electrodes 308, 310) of the memory cell. The first two pulses in diagram 502 are "positive" programming pulses and the last two pulses are "negative" programming pulses. A positive programming pulse refers to a programming pulse with "positive polarity," which can also be referred to as "forward polarity." A negative programming pulse is a program pulse with "negative polarity," which can also be referred to as "reverse polarity." In one example, whether or not a programming pulse is positive or negative is based on the relative voltages applied to the terminals of the memory cell (e.g., 300). A program pulse can be defined as positive if the resulting voltage applied to one of the terminals is more positive than the voltage applied to a second of the terminals. For example, referring to FIG. 3, a positive program pulse can include: a positive voltage applied to electrode 308 and a negative voltage applied to electrode 310; a positive voltage applied to 308 and 0 V (e.g., circuit ground or neutral reference) applied to electrode 310; 0V applied to electrode 308 and a negative voltage applied to electrode 310, positive voltages applied to both electrodes 308 and 310, but where the voltage applied to electrode 308 is greater than the voltage applied to electrode 310; or negative voltages applied to both electrodes 308 and 310, but where the magnitude of the voltage applied to electrode 310 is greater than the magnitude of the voltage applied to electrode 308.

A program pulse applied to the terminals of the memory cell (e.g., 300) would be negative if the voltage applied to electrode 310 is more positive than the voltage applied to electrode 308. For example, a negative program pulse can include: a negative voltage applied to electrode 308 and a positive voltage applied to electrode 310; a negative voltage applied to electrode 308 and 0 V (e.g., circuit ground or neutral reference) applied to electrode 310; 0V applied to electrode 308 and a positive voltage applied to electrode 310, negative voltages applied to both electrodes 308 and 310, but where the magnitude of the voltage applied to electrode 308 is greater than the magnitude of the voltage applied to electrode 310; or positive voltages applied to both electrodes 308 and 310, but where the magnitude of the voltage applied to electrode 310 is greater than the magnitude of the voltage applied to electrode 308.

Write-read graph 504 depicts threshold voltages exhibited by a memory cell (e.g., 300) based on positive and negative program polarities and positive read polarity. The graph 504 assumes an arbitrary program slope magnitude and sign for sake of illustration, but various memory cells 300 may respond differently to program and read pulses (e.g., some storage materials 302 may decrease threshold voltage with rising program amplitude or may retain a constant threshold voltage responsive to rising program voltages).

Threshold voltage curve 508 depicts example threshold voltages when a positive program pulse is used for programming and a positive pulse is used for reading. As depicted, in such a scenario, the threshold voltage rises as a function of the magnitude of the program pulse. For example, when a program pulse of +PA1 is used, the threshold voltage of the cell is just below a first positive demarcation read voltage (+$V_{DM1}$) and when a program pulse of +PA2 is used, the threshold voltage of the cell is between the first positive demarcation read voltage and a second positive demarcation read voltage (+$V_{DM2}$).

Threshold voltage curve 514 depicts example threshold voltages when a negative program pulse is used for programming, but a positive pulse is used for reading. As depicted, in such a scenario, the threshold voltage increases as a function of the magnitude of the program pulse (i.e., as the amplitude of the program pulse becomes more negative). For example, when a program pulse of −PA1' is used, the threshold voltage of the cell is above the second positive read voltage (+$V_{DM2}$) and when a program pulse of −PA2 is used, the threshold voltage of the cell is further above the second positive read voltage.

Write-read graph 505 depicts threshold voltages exhibited by a memory cell (e.g., 300) based on positive and negative program polarities and negative read polarity. In some embodiments, the memory cell represented in graph 505 may be the same memory cell represented in graph 504 (although in other embodiments, the memory cell may respond differently to the various program and read pulses). The graph 505 assumes an arbitrary program slope magnitude and sign for sake of illustration, but various memory cells 300 may respond differently to program and read pulses (e.g., some storage materials 302 may decrease threshold voltage with rising program magnitude or may retain a constant threshold voltage responsive to rising program magnitude).

Threshold voltage curve 510 depicts example threshold voltages when a positive program pulse is used for programming, but a negative pulse is used for reading. In the depicted scenario, the threshold voltage falls (becomes more negative) as the magnitude of the program pulse rises. For example, when a program pulse of +PA1 is used, the threshold voltage of the cell is well lower (more negative) than a second negative demarcation read voltage (−$V_{DM2}'$) and when a program pulse of +PA2 is used, the threshold voltage of the cell is even further below the second negative demarcation read voltage. The curve 508 and the curve 510 may depict the same program states (for certain storage materials, though other storage materials may react differently), but the sensed threshold voltage is dependent on whether the memory cell is read using a positive polarity or a negative polarity.

Threshold voltage curve 512 depicts example threshold voltages when a negative program pulse is used for programming and a negative pulse is used for reading. As with curve 510, in such a scenario, the threshold voltage decreases (becomes more negative) as the magnitude of the program pulse rises. For example, when a program pulse of −PA1' is used, the threshold voltage of the cell is just above (less negative than) a first negative demarcation read voltage (−$V_{DM1}'$) and when a program pulse of −PA2' is used, the threshold voltage of the cell is below (more negative than) the first negative demarcation read voltage. The curve 512 and the curve 514 may depict the same program states (for certain storage materials, though other storage materials may react differently), but the sensed threshold voltage is dependent on whether the memory cell is read using a positive polarity or a negative polarity.

As depicted in 504 and 505, in some implementations, the memory cell 300 may exhibit a threshold voltage with a magnitude that is different depending on the polarity of the read voltage applied (e.g., the memory cell 300 may exhibit an asymmetric response to a read voltage). For example, if a positive read voltage were to be used to sense a state of the memory cell programmed using −PA1', the positive read voltage would need to be larger in magnitude than the magnitude of the first negative read voltage (−$V_{DM1}'$). By utilizing both positive and negative read voltages to sense multi-level memory cells, the magnitude of the read voltage with the largest magnitude may be reduced relative to an implementation in which only positive read voltage pulses or only negative read voltage pulses are used for read operations, thus simplifying circuit implementation and reducing power usage.

In read flow 506, a first positive read voltage (+$V_{DM1}$) is applied to the memory cell 300. If the memory cell thresholds (e.g., if a determination is made that the threshold voltage of the memory cell is less than the read voltage), then a determination that the memory cell has a state of 11 (i.e., both bits stored by the cell have a value of 1) is made. If the cell does not threshold, then a second positive read voltage (+$V_{DM2}$) larger than the first positive read voltage is applied to the memory cell. If the cell thresholds, it is determined that the memory cell has a state of 10 (the first bit of the cell has a value of 1 and the second bit of the cell has a value of 0). If the cell does not threshold, then a negative read voltage (−$V_{DM1}'$) is applied. If the cell thresholds, then it is determined that the cell has a state of 01. If the cell does not threshold, then it is determined that the cell has a state of 00.

FIG. 6 illustrates program and read characteristics of a multi-level memory cell programmed using differing pulse widths in a bipolar nature in accordance with certain embodiments. FIG. 6 illustrates program response diagram 602, a write-read graph 604, and a read flow 606. The write-read graph 604 is similar to the write-read graphs 504 and 505, but combines the curves for negative and positive read polarities into one graph.

Program response diagram 602 illustrates four program pulses and resulting memory cell program states. As depicted, a first program pulse with a pulse width of +PW2 results in a program state of 11, a second program pulse with a pulse width of +PW1 results in a program state of 10, a third program pulse with a pulse width of −PW2' results in a program state of 01, and a fourth program pulse with a pulse width of −PW1' results in a program state of 00. The pulse amplitudes are each the same in this embodiment. The notation "+" and "−" before the pulse width label denotes the polarity of program pulse amplitudes, that is "positive" and "negative", respectively. The program states are arbitrary and could be assigned differently in other embodiments.

As described above, whether or not a voltage or current applied to a memory cell programs the cell to the desired state depends upon the polarity, magnitude, and duration of the applied program pulse. In FIG. 6, the different states are programmed by varying the width and polarity of the program pulses, while the amplitudes of the pulses are held constant.

The first two pulses in diagram 602 are "positive" programming pulses and the last two pulses are "negative" programming pulses. Write-read graph 604 depicts threshold voltages exhibited by a memory cell (e.g., 300) based on program pulse width and polarity and read pulse polarity and magnitude. The graph 604 assumes an arbitrary program slope magnitude and sign for sake of illustration, but various memory cells 300 may respond differently to program pulse and read voltages (e.g., some storage materials 302 may increase threshold voltage with increasing program pulse width (assuming a positive polarity read voltage), decrease threshold voltage with increasing program pulse width (assuming a negative read voltage), or may retain a constant threshold voltage responsive to rising program pulse width).

Threshold voltage curve 608 depicts example threshold voltages when a positive program pulse is used for programming and a positive pulse is used for reading. As depicted, in such a scenario, the threshold voltage decreases as a function of the width of the program pulse. For example, when a program pulse of +PW2 is used, the threshold voltage of the cell is just below a first positive read voltage (+$V_{DM1}$) and when a shorter program pulse of +PW1 is used, the threshold voltage of the cell is between the first positive read voltage and a second positive read voltage (+$V_{DM2}$). The notation "+" and "−" before the pulse width label denotes the polarity of program pulse amplitudes, that is "positive" and "negative", respectively.

Threshold voltage curve 610 depicts example threshold voltages when a positive program pulse is used for programming, but a negative pulse is used for reading. The curve 608 and the curve 610 depict the same program states (although some memory cells may exhibit different program characteristics), but the sensed threshold voltage is dependent on whether the memory cell is read using a positive polarity or a negative polarity. In the depicted scenario, the threshold voltage rises as a function of the magnitude of the program pulse width. For example, when a program pulse of +PW2 is used, the threshold voltage of the cell is well below a first negative read voltage ($-V_{DM1}'$) and when a shorter program pulse of +PW1 is used, the threshold voltage of the cell is even further below the first negative read voltage.

Threshold voltage curve 612 depicts example threshold voltages when a negative program pulse is used for programming and a negative pulse is used for reading. As depicted, in such a scenario, the threshold voltage increases as a function of the width of the program pulse. For example, when a program pulse of $-PW2'$ is used, the threshold voltage of the cell is just above a negative read voltage ($-V_{DM1}'$) and when a shorter program pulse of $-PW1'$ is used, the threshold voltage of the cell is below the negative read voltage. The notation "+" and "−" before the pulse width label denotes the polarity of program pulse amplitudes, that is "positive" and "negative", respectively.

Threshold voltage curve 614 depicts example threshold voltages when a negative program pulse is used for programming, but a positive pulse is used for reading. The curve 612 and the curve 614 depict the same program states (although some memory cells may exhibit different program characteristics or relationships), but the sensed threshold voltage is dependent on whether the memory cell is read using a positive polarity or a negative polarity. As depicted, in such a scenario, the threshold voltage decreases as a function of the program pulse width. For example, when a program pulse of $-PW2'$ is used, the threshold voltage of the cell is above the second positive read voltage ($+V_{DM2}$) and when a shorter program pulse of $-PW1'$ is used, the threshold voltage of the cell is further above the second positive read voltage. The notation "+" and "−" before the pulse width label denotes the polarity of program pulse amplitudes, that is "positive" and "negative", respectively.

In read flow 606, a first positive read voltage ($+V_{DM1}$) is applied to the memory cell 300. If the memory cell thresholds (e.g., if a determination is made that the threshold voltage of the memory cell is less than the read voltage), then a determination that the memory cell has a state of 11 is made. If the cell does not threshold, then a second positive read voltage ($+V_{DM2}$) larger than the first positive read voltage is applied to the memory cell. If the cell thresholds, it is determined that the memory cell has a state of 10. If the cell does not threshold, then a negative read voltage ($-V_{DM1}'$) is applied. If the cell thresholds, then it is determined that the cell has a state of 01. If the cell does not threshold, then it is determined that the cell has a state of 00.

It should be noted that with respect to FIGS. 5 and 6, the demarcation voltages, pulse amplitudes, and pulse widths may be, but are not necessarily symmetrical. For example, $+V_{DM1}$ and $-V_{DM1}'$ may or may not have the same magnitude, +PA1 and −PA1' may or may not have the same magnitude, and the width of +PW2 and −PW2' may or may not be the same. Furthermore, an alternative read flow could apply two negative read voltages and a single positive read voltage rather than two positive read voltages and a single negative read voltage.

Figure 7:
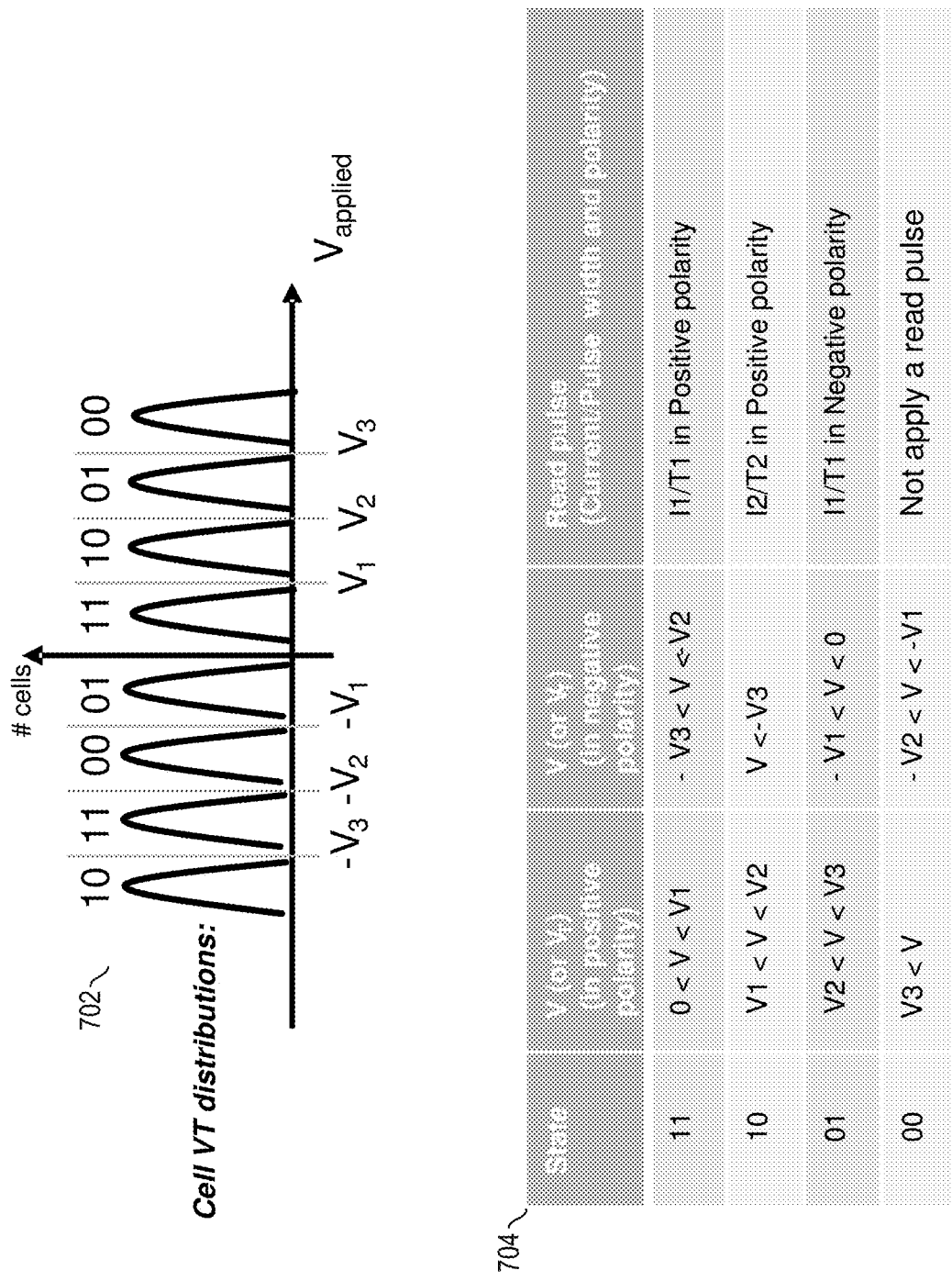
FIG. 7 illustrates program and read characteristics of a multi-level memory cell programmable in a bipolar nature in accordance with certain embodiments.

FIG. 7 illustrates program and read characteristics of a multi-level memory cell programmable in a bipolar nature in accordance with certain embodiments. FIG. 7 includes a threshold voltage distribution graph 702 and a table 704 depicting program and read information for a memory cell (e.g., 300). Graph 702 depicts distributions of threshold voltages of a memory cell where the y-axis represents the number of cells having a particular threshold voltage on the x-axis. In this graph, four different program states are depicted: 11, 10, 01, and 00. 11 and 10 may represent states programmed using positive program pulses and 00 and 01 represent states programmed using negative pulses. Each program state has both a positive threshold voltage (a threshold voltage when read using a positive read pulse) and a negative threshold voltage (a threshold voltage when read using a negative read pulse).

Table 704 depicts various states of the memory cell and corresponding threshold voltage ranges in the direction of positive polarity read and negative polarity read. Table 704 also depicts read characteristics for the memory cell. For example, the table shows a read pulse that is applied to the cell if the cell thresholds at a particular read voltage. Because the thresholding of the cell alters the threshold value of the cell, the read pulse is applied to refresh the memory cell (e.g., write back the program state to the cell) after the read. In various embodiments, the read pulse has the same characteristics (e.g., polarity, width, amplitude) as the program pulse that was originally used to program the cell. Accordingly, due to the refresh operation, the read operation described herein may be immune to read disturbance. The table may correspond to the flow of FIG. 8.

Figure 8:
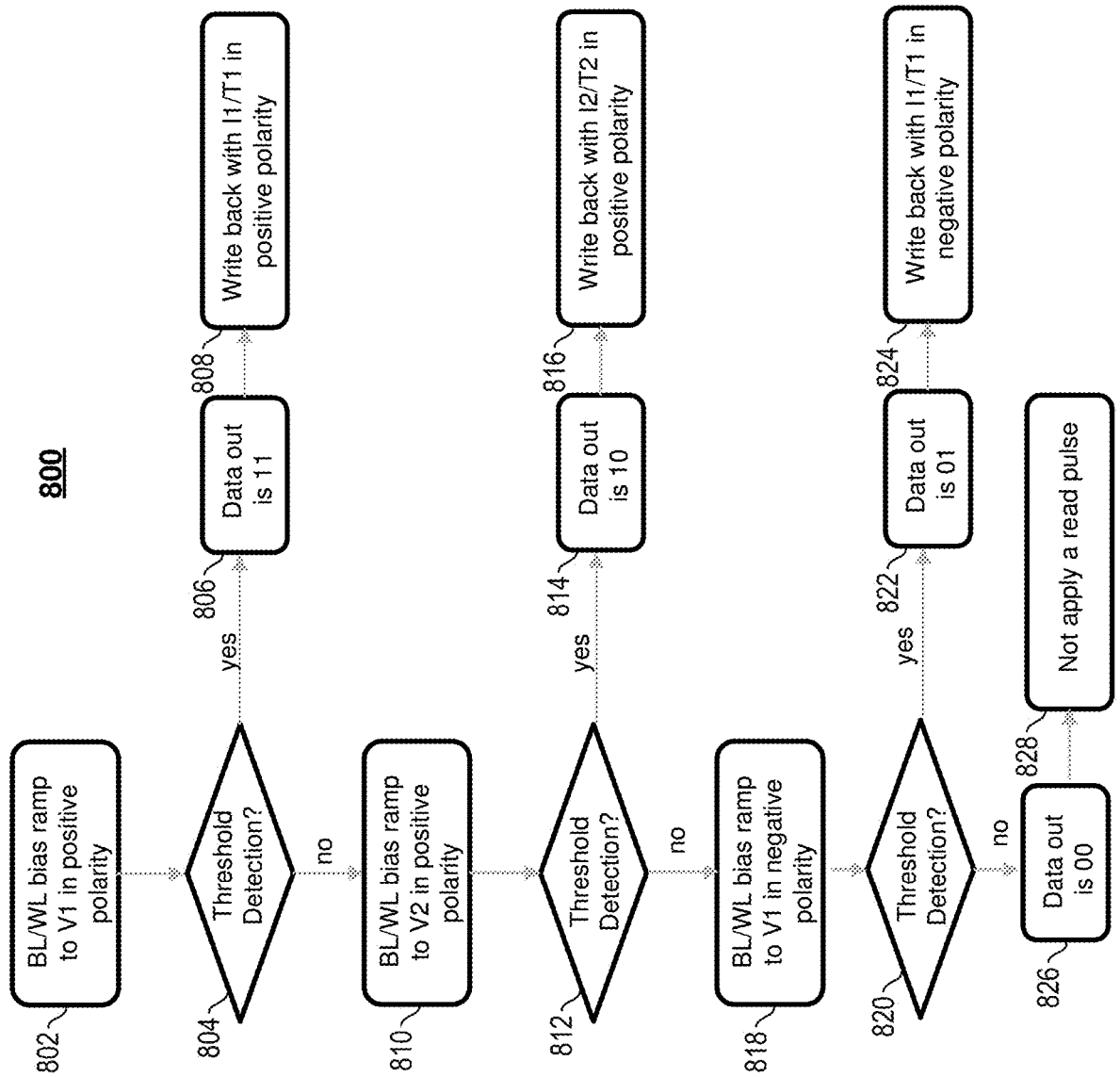
FIG. 8 illustrates a flow for reading the program state of a multi-level memory cell programmable in a bipolar nature in accordance with certain embodiments.

FIG. 8 illustrates a flow 800 for reading the program state of a multi-level memory cell programmed using a bipolar scheme in accordance with certain embodiments. This flow 800 may provide a read disturb-immune approach for a bipolar read operation.

At 802, a BL and WL coupled to a target memory cell are ramped up such that a first positive read voltage (V1) is applied to the memory cell. At 804, a determination is made as to whether the cell has a threshold voltage lower than the read voltage (e.g., based on an amount of current through the cell). If so, a determination that the cell stored a logical value of 11 is made at 806 (and the logical value may be returned through the read operation). At 808, the cell is then refreshed by applying a pulse having a positive polarity, a current amplitude of I1, and a width of T1.

If the cell does not threshold at 804, then at 810, the BL and WL coupled to the target memory cell are ramped up such that a second positive read voltage (V2) is applied to the memory cell. At 812, a determination is made as to whether the cell has a threshold voltage lower than the read voltage. If so, a determination that the cell stored a logical value of 10 is made at 814. At 816, the cell is then refreshed by applying a pulse having a positive polarity, a current amplitude of I2, and a width of T2.

If the cell does not threshold at 812, then at 818, the BL and WL coupled to the target memory cell are ramped down such that a negative read voltage (−V1) is applied to the memory cell. At 820, a determination is made as to whether the cell has a threshold voltage higher than the negative polarity read voltage. If so, a determination that the cell stored a value of 01 is made at 822. At 824, the memory cell is then refreshed by applying a pulse having a negative polarity, a current amplitude of I1, and a width of T1.

If the cell does not have a threshold voltage that is higher than the negative polarity read voltage at 820, then a determination is made that the cell stored a value of 00 at 826. At 828, thresholding of the cell is not performed. For example, no further read voltages are applied because the cell has not "thresholded", and the cell does not need to be written back to.

In various embodiments, I1 may be equal to or may be different from I2 (e.g., I1 and I2 may be the same if T1 and T2 are different) or T1 may be the same as or different from T2 (e.g., T1 and T2 may be the same if I1 and I2 are different).

Figure 9:
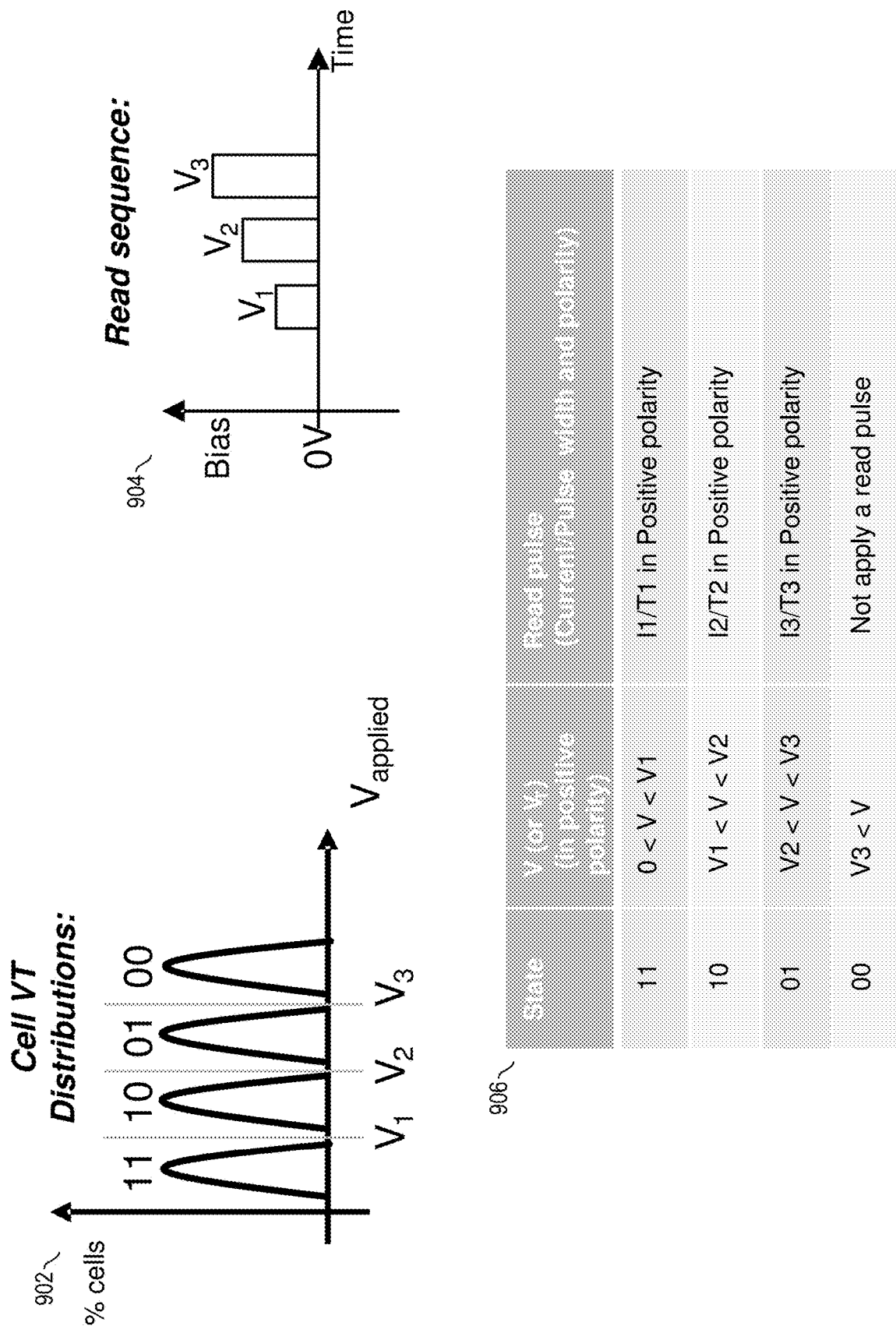
FIG. 9 illustrates program and read characteristics of a multi-level memory cell programmable in a unipolar nature in accordance with certain embodiments.

FIG. 9 illustrates program and read characteristics of a multi-level memory cell programmable in a unipolar nature in accordance with certain embodiments. FIG. 9 includes a threshold voltage distribution graph 902, a read sequence 904, and a table 906 depicting program and read information for a memory cell (e.g., 300). Graph 902 depicts distributions of threshold voltages of a memory cell where the y-axis represents the percentage of cells having a particular threshold voltage on the x-axis. In this graph, four different program states are depicted: 11, 10, 01, and 00. Each of these states is programmed using a positive program pulse.

Read sequence 904 depicts various demarcation voltages ($V_1$, $V_2$, $V_3$) that may be applied to the cell during a read sequence to determine a threshold voltage (and corresponding program state) of the memory cell. As depicted, the first read voltage is the smallest read voltage and the last read voltage is the largest read voltage. In operation, not all of the read voltages are applied every time (e.g., the read operation may complete after a cell thresholds in response to one of the read voltages and the read pulse is applied to program the cell back to its state before the thresholding).

Table 906 depicts various states of the memory cell and corresponding threshold voltage ranges in the direction of positive polarity and negative polarity reads. Table 906 also depicts read characteristics for the memory cell. For example, the table shows a read pulse that is applied to the cell if the cell thresholds at a particular read voltage. Because the thresholding of the cell alters the threshold value of the cell, the read pulse is applied to be able to refresh the cell after the read. Accordingly, the read operation described herein provides immunity to read disturbance since a refresh is performed. The table 906 may correspond to the flow of FIG. 10.

Figure 10:
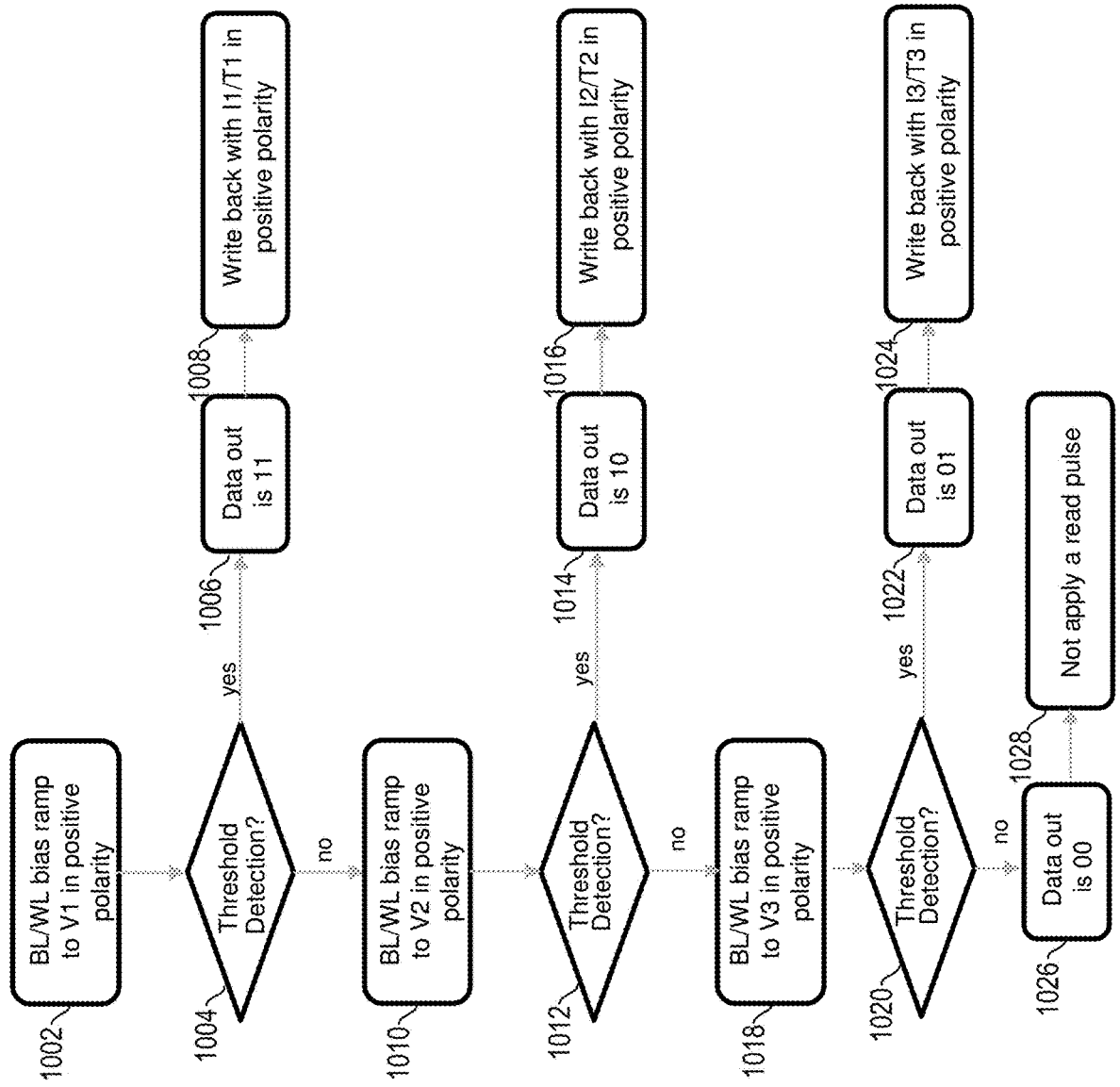
FIG. 10 illustrates a flow for reading the program state of a multi-level memory cell programmable in a unipolar nature in accordance with certain embodiments.

FIG. 10 illustrates a flow for reading the program state of a multi-level memory cell programmable in a unipolar nature in accordance with certain embodiments. This flow 1000 may provide a read disturb-immune approach for a bipolar read operation.

At 1002, a BL and WL coupled to a target memory cell are ramped up such that a first positive read voltage (V1) is applied to the memory cell. At 1004, a determination is made as to whether the cell has a threshold voltage that is lower than the read voltage. If so, a determination that the cell stored a value of 11 is made at 1006. At 1008, the cell is then refreshed by applying a pulse having a positive polarity, current amplitude of I1, and width of T1.

At 1010, the BL and WL coupled to the target memory cell are ramped up such that a second positive read voltage (V2) is applied to the memory cell. At 1012, a determination is made as to whether the cell has a threshold voltage that is lower than the read voltage. If so, a determination that the cell stored a value of 10 is made at 1014. At 1016, the cell is then refreshed by applying a pulse having a positive polarity, current amplitude of I2, and a width of T2.

At 1018, the BL and WL coupled to the target memory cell are ramped up such that a third positive read voltage (V3) is applied to the memory cell. At 1020, a determination is made as to whether the cell has a threshold voltage that is lower than the read voltage. If so, a determination that the cell stored a value of 01 is made at 1022. At 1024, The memory cell is then refreshed by applying a pulse having a positive polarity with a current amplitude of I3 and a width of T3.

If the cell does not threshold at 1020, then a determination is made that the cell stored a value of 00 at 1026. At 1028, thresholding of the cell is inhibited. For example, no further read voltages are applied and because the cell has not "thresholded", the cell does not need to be written back to.

In various embodiments, I1 may be equal to or may be different from I2 or I3 (e.g., I1, I2, and I3 may be the same if T1, T2, and T3 are different) or T1 may be the same as or different from T2 or T3 (e.g., T1, T2, and T3 may be the same if I1, I2, and I3 are different). As in the pulses described previously, such pulses may have any suitable shapes.

FIG. 11 illustrates program characteristics of a memory cell having eight programmable states in accordance with certain embodiments. Program techniques described earlier may be combined to program a memory cell to any suitable number of states. FIG. 11 depicts an embodiment in which a combination of program pulses with varying amplitude, polarity, and width are used to program eight different states into memory cells (e.g., 300). Thus, the example memory cell may store 3 bits. In other embodiments, the memory cell 300 may store additional states (enabling a memory cell to represent any suitable number of bits) by further variance of characteristics of the program pulses.

FIG. 11 illustrates program response diagrams 1102 and 1104 and a write-read graph 1106. Program response diagram 1102 illustrates four positive program pulses and resulting memory cell program states. Program response diagram 1104 illustrates four negative program pulses and resulting memory cell program states. As depicted in 1102, a first program pulse with a pulse width of +PW2 and amplitude +PA1 results in a program state of 111, a second program pulse with a pulse width of +PW2 and amplitude of +PA2 results in a program state of 110, a third program pulse with a pulse width of +PW1 and amplitude of +PA1 results in a program state of 101, and a fourth program pulse with a pulse width of +PW1 and amplitude of +PA2 results in a program state of 100. As depicted in 1104, a first program pulse with a pulse width of −PW2' and amplitude −PA1' results in a program state of 011, a second program pulse with a pulse width of −PW2' and amplitude of −PA2' results in a program state of 010, a third program pulse with a pulse width of −PW1' and amplitude of −PA1' results in a program state of 001, and a fourth program pulse with a pulse width of −PW1' and amplitude of −PA2' results in a program state of 000. The program states are arbitrary and could be assigned differently in other embodiments.

As described above, whether or not a voltage applied to a memory cell programs the cell to the desired state depends upon the polarity, magnitude, and duration of the applied program pulse. In FIG. 11, the different states are programmed by varying the width, polarity, and amplitude of the program pulses.

The pulses in diagram 1102 are "positive" programming pulses and the pulses in diagram 1104 are "negative" programming pulses. Write-read graph 1106 depicts threshold voltages exhibited by a memory cell (e.g., 300) based on program pulse width, amplitude, and polarity and read pulse polarity. The graph 1106 assumes an arbitrary program slope magnitude and sign for sake of illustration, but various memory cells 300 may respond differently to program and read voltages.

Threshold voltage curve 1108 depicts example threshold voltages when a positive program pulse having width +PW2 is used for programming and a positive pulse is used for reading. As depicted, in such a scenario, the threshold voltage rises as a function of the amplitude of the program pulse. For example, when the amplitude +PA1 is used, the threshold voltage of the cell is below a first positive read voltage (+$V_{DM1}$) and when a higher program pulse amplitude +PA2 is used, the threshold voltage of the cell is above the first positive read voltage and just below a second positive read voltage (+$V_{DM2}$).

Threshold voltage curve 1110 depicts example threshold voltages when a positive program pulse with width +PW2 is used for programming, but a negative pulse is used for reading. The curve 1108 and the curve 1110 depict the same program states, but the sensed threshold voltage is dependent on whether the memory cell is read using a positive polarity or a negative polarity. In the depicted scenario, the threshold voltage falls as the amplitude of the program pulse rises. For example, when a program pulse amplitude of +PA1 is used, the threshold voltage of the cell is well below a third negative read voltage (−$V_{DM3}$') and when a program pulse amplitude of +PA2 is used, the threshold voltage of the cell is even further below the third negative read voltage.

Threshold voltage curve 1112 may correspond to curve 1114, curve 1116 may correspond to curve 1118, and curve 1120 may correspond to curve 1122. The curves may have the characteristics shown, although in other embodiments, the curves may have any suitable characteristics depending on the storage material used within the memory cell.

During a read operation, any suitable read voltages may be applied in any suitable order to determine the state of the cell. For example, in a unipolar case, only positive voltages may be applied in order of increasing magnitude (including additional positive read voltages greater than +VDM4 to resolve the states programmed using negative program pulses on curves 1116 and 1120). As another example, during the read operation, the positive read voltages may be applied in order of increasing magnitude (e.g., +$V_{DM1}$, +$V_{DM2}$, +$V_{DM3}$, and +$V_{DM4}$) and then the negative read voltages may be applied in order of increasing magnitude (e.g., −$V_{DM1}$', −$V_{DM2}$', −$V_{DM3}$'). In other embodiments, the order in which the positive and negative read voltages are applied may be varied. For example, a positive read voltage (e.g., +$V_{DM1}$) may be applied, then a negative read voltage (e.g., −$V_{DM1}$'), then another positive read voltage (e.g., +$V_{DM2}$), then another negative read voltage (e.g., −$V_{DM2}$'), and so on. Such an embodiment may reduce overall read disturb by reducing the magnitude of the highest magnitude voltage applied during some read operations. During various read operations, any suitable combination of positive and negative read voltages may be used. For example, a particular positive read voltage could be used in place of a particular negative read voltage, or vice versa. If the memory cell thresholds after application of any of these read voltages, the corresponding program state is determined, the cell may be refreshed (e.g., using the same pulse used to initially program the memory cell), and the read operation is concluded.

Figure 12:
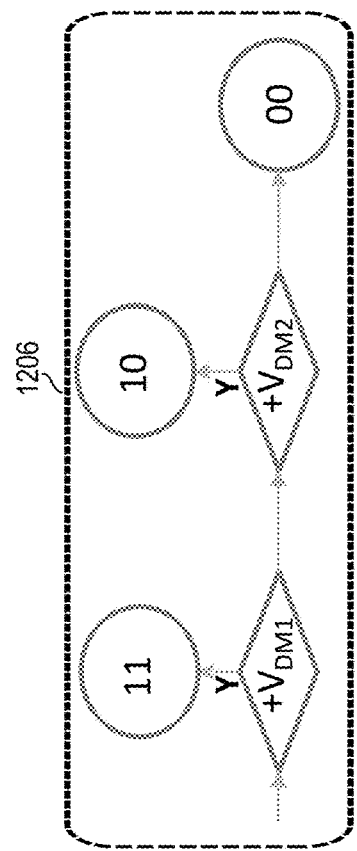
FIG. 12 illustrates program and read characteristics of a memory cell having three programmable states in accordance with certain embodiments.
Figure 12:
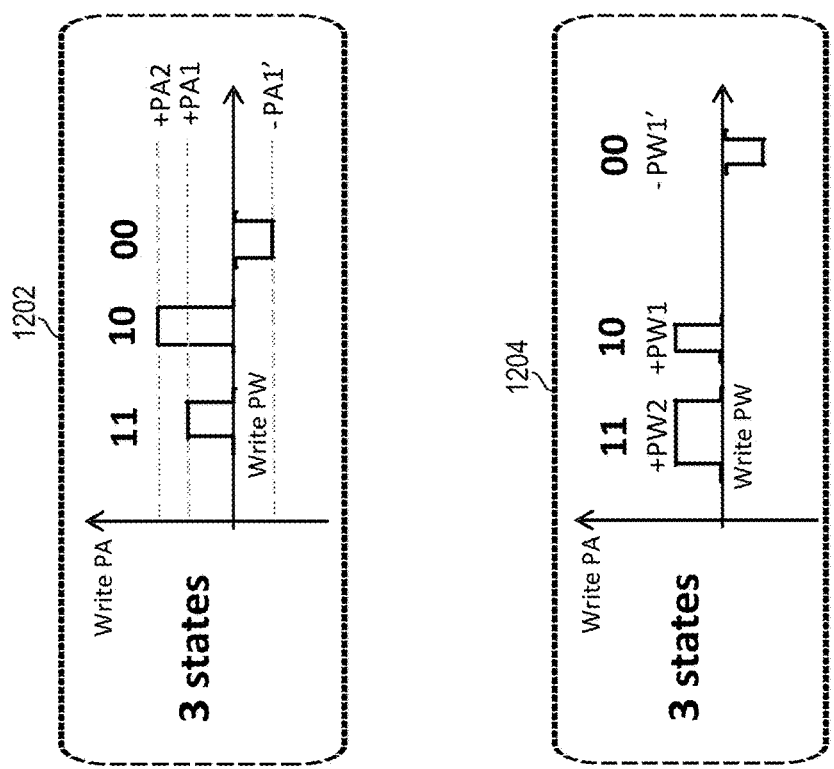

FIG. 12 illustrates program and read characteristics of a memory cell having three programmable states in accordance with certain embodiments. FIG. 12 illustrates program response diagram 1202, program response diagram 1204, and read flow 1206. Diagram 1202 shows a scheme for storing 3 states per memory cell by varying the amplitude and polarity of a program pulse, while diagram 1204 shows a scheme for storing 3 states per memory cell by varying the pulse width and polarity of the program pulse. Flow 1206 shows a read flow for determining which of the three program states the memory cell has been programmed to. As with other read flows illustrated herein, once a cell thresholds due to a read voltage, the cell may be refreshed, and the read operation may terminate.

The flows described in FIGS. 5-6, 8, and 10-12 are merely representative of operations that may occur in particular embodiments. Some of the operations illustrated in the FIGs. may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory partition controller 210, wordline control logic 214, bitline control logic 216, WL switch circuitry 220, BL switch circuitry 224, access circuitry 342, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, e.g. reset, while an updated value potentially includes a low logical value, e.g. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (e.g., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Example 1 may include a memory device includes a three dimensional crosspoint memory array comprising memory cells each comprising two terminals and a storage element programmable to one of a plurality of program states each representing distinct values for at least two bits; and access circuitry to apply a first program pulse with a positive polarity across the two terminals of a first memory cell of the memory cells to program the first memory cell to a first program state of the program states; and apply a second program pulse with a negative polarity across the two terminals of the first memory cell to program the first memory cell to a second program state of the program states.

Example 2 may include the subject matter of Example 1, wherein the first memory cell comprises a first layer of chalcogenide material to function as a selector device and a second layer of chalcogenide material to function as the storage element.

Example 3 may include the subject matter of Example 1, wherein the first memory cell comprises a chalcogenide material to function as both a selector device and the storage element.

Example 4 may include the subject matter of any one of Examples 1-3, wherein the access circuitry is to apply a third program pulse with a negative polarity across the two terminals of the first memory cell to program the first memory cell to a third program state of the program states; wherein the third program pulse has a different amplitude than the second program pulse but has the same pulse width as the second program pulse.

Example 5 may include the subject matter of any one of Examples 1-3, wherein the access circuitry is to apply a third program pulse with a negative polarity across the two terminals of the first memory cell to program the first memory cell to a third program state of the program states; wherein the third program pulse has the same amplitude as the second program pulse but has a different pulse width.

Example 6 may include the subject matter of any one of Examples 1-3, wherein the access circuitry is to apply a third program pulse with a negative polarity across the two terminals of the first memory cell to program the first memory cell to a third program state of the program states; wherein the third program pulse has a different amplitude and a different pulse width from the second program pulse.

Example 7 may include the subject matter of any one of Examples 1-6, wherein the storage element is programmable to one of a plurality of program states each representing distinct values for three bits, wherein the access circuitry is to program the different program states to the memory cells by varying amplitude, polarity, and pulse width of program pulses applied to the terminals of the memory cells.

Example 8 may include the subject matter of any one of Examples 1-7, the access circuitry to apply a series of exclusively positive read voltages to the terminals of the first memory cell to determine the program state of the first memory cell.

Example 9 may include the subject matter of any one of Examples 1-7, the access circuitry to apply a series of read voltages having positive polarities and then at least one read voltage having a negative polarity to the terminals of the first memory cell to determine the program state of the first memory cell.

Example 10 may include the subject matter of any one of Examples 1-9, the access circuitry to apply to the terminals of the first memory cell a fourth program pulse having a pulse magnitude, pulse width, and pulse polarity that are substantially similar to a pulse magnitude, pulse width, and pulse polarity of a third program pulse used to program the first memory cell, wherein the fourth program pulse is to refresh the program state of the first memory cell responsive to a determination that a read voltage has caused the first memory cell to undergo a threshold event.

Example 11 may include the subject matter of any one of Examples 1-10, wherein the read voltage has a positive polarity and the fourth program pulse has a positive polarity.

Example 12 may include the subject matter of any one of Examples 1-10, wherein the read voltage has a negative polarity and the fourth program pulse has a negative polarity.

Example 13 may include the subject matter of any one of Examples 1-12, further comprising a plurality of memory chips, wherein a first memory chip comprises the memory array and access circuitry.

Example 14 may include the subject matter of Example 13, further comprising a memory controller to communicate with the plurality of memory chips.

Example 15 may include the subject matter of any one of Examples 1-14, wherein the memory device comprises a solid state drive.

Example 16 may include the subject matter of any one of Examples 1-14, wherein the memory device comprises a dual in-line memory module.

Example 17 may include a method comprising applying a first program pulse with a positive polarity across two terminals of a first memory cell of a plurality of memory cells of a three dimensional crosspoint memory array to program the first memory cell to a first program state of a plurality of program states, wherein the memory cells each comprise two terminals and a storage element programmable to one of a plurality of program states each representing distinct values for at least two bits; and applying a second program pulse with a negative polarity across the two terminals of the first memory cell to program the first memory cell to a second program state of the program states.

Example 18 may include the subject matter of Example 17, wherein the first memory cell comprises a first layer of chalcogenide material to function as a selector device and a second layer of chalcogenide material to function as the storage element.

Example 19 may include the subject matter of Example 17, wherein the first memory cell comprises a chalcogenide material to function as both a selector device and the storage element.

Example 20 may include the subject matter of any one of Examples 17-19, further comprising applying a third program pulse with a negative polarity across the two terminals of the first memory cell to program the first memory cell to a third program state of the program states; wherein the third program pulse has a different amplitude than the second program pulse but has the same pulse width as the second program pulse.

Example 21 may include the subject matter of any one of Examples 17-19, further comprising applying a third program pulse with a negative polarity across the two terminals of the first memory cell to program the first memory cell to a third program state of the program states; wherein the third program pulse has the same amplitude as the second program pulse but has a different pulse width.

Example 22 may include the subject matter of any one of Examples 17-19, further comprising applying a third program pulse with a negative polarity across the two terminals of the first memory cell to program the first memory cell to a third program state of the program states; wherein the third program pulse has a different amplitude and a different pulse width from the second program pulse.

Example 23 may include the subject matter of any one of Examples 17-22, wherein the storage element is programmable to one of a plurality of program states each representing distinct values for three bits, and further comprising programming the different program states to the memory cells by varying amplitude, polarity, and pulse width of program pulses applied to the terminals of the memory cells.

Example 24 may include the subject matter of any one of Examples 17-23, further comprising applying a series of exclusively positive read voltages to the terminals of the first memory cell to determine the program state of the first memory cell.

Example 25 may include the subject matter of any one of Examples 17-23, further comprising applying a series of read voltages having positive polarities and then at least one read voltage having a negative polarity to the terminals of the first memory cell to determine the program state of the first memory cell.

Example 26 may include the subject matter of any one of Examples 17-25, further comprising applying to the terminals of the first memory cell a fourth program pulse having a pulse magnitude, pulse width, and pulse polarity that are substantially similar to a pulse magnitude, pulse width, and pulse polarity of a third program pulse used to program the first memory cell, wherein the fourth program pulse is to refresh the program state of the first memory cell responsive to a determination that a read voltage has caused the first memory cell to undergo a threshold event.

Example 27 may include the subject matter of any one of Examples 17-26, wherein the read voltage has a positive polarity and the fourth program pulse has a positive polarity.

Example 28 may include the subject matter of any one of Examples 17-26, wherein the read voltage has a negative polarity and the fourth program pulse has a negative polarity.

Example 29 may include a system comprising a storage device controller; and at least one memory chip, wherein a memory chip comprises a three dimensional crosspoint memory array comprising memory cells each comprising two terminals and a storage element programmable to one of a plurality of program states each representing distinct values for at least two bits; and access circuitry to apply a first program pulse with a positive polarity across the two terminals of a first memory cell of the memory cells to program the first memory cell to a first program state of the program states; and apply a second program pulse with a negative polarity across the two terminals of the first memory cell to program the first memory cell to a second program state of the program states.

Example 30 may include the subject matter of Example 29, wherein the first memory cell comprises a first layer of chalcogenide material to function as a selector device and a second layer of chalcogenide material to function as the storage element.

Example 31 may include the subject matter of Example 29, wherein the first memory cell comprises a chalcogenide material to function as both a selector device and the storage element.

Example 32 may include the subject matter of any one of Examples 29-31, wherein the access circuitry is to apply a third program pulse with a negative polarity across the two terminals of the first memory cell to program the first memory cell to a third program state of the program states; wherein the third program pulse has a different amplitude than the second program pulse but has the same pulse width as the second program pulse.

Example 33 may include the subject matter of any one of Examples 29-31, wherein the access circuitry is to apply a third program pulse with a negative polarity across the two terminals of the first memory cell to program the first memory cell to a third program state of the program states; wherein the third program pulse has the same amplitude as the second program pulse but has a different pulse width.

Example 34 may include the subject matter of any one of Examples 29-31, wherein the access circuitry is to apply a third program pulse with a negative polarity across the two terminals of the first memory cell to program the first memory cell to a third program state of the program states; wherein the third program pulse has a different amplitude and a different pulse width from the second program pulse.

Example 35 may include the subject matter of any one of Examples 29-34, wherein the storage element is programmable to one of a plurality of program states each representing distinct values for three bits, wherein the access circuitry is to program the different program states to the memory cells by varying amplitude, polarity, and pulse width of program pulses applied to the terminals of the memory cells.

Example 36 may include the subject matter of any one of Examples 29-35, the access circuitry to apply a series of exclusively positive read voltages to the terminals of the first memory cell to determine the program state of the first memory cell.

Example 37 may include the subject matter of any one of Examples 29-35, the access circuitry to apply a series of read voltages having positive polarities and then at least one read voltage having a negative polarity to the terminals of the first memory cell to determine the program state of the first memory cell.

Example 38 may include the subject matter of any one of Examples 29-37, the access circuitry to apply to the terminals of the first memory cell a fourth program pulse having a pulse magnitude, pulse width, and pulse polarity that are substantially similar to a pulse magnitude, pulse width, and pulse polarity of a third program pulse used to program the first memory cell, wherein the fourth program pulse is to refresh the program state of the first memory cell responsive to a determination that a read voltage has caused the first memory cell to undergo a threshold event.

Example 39 may include the subject matter of any one of Examples 29-38, wherein the read voltage has a positive polarity and the fourth program pulse has a positive polarity.

Example 40 may include the subject matter of any one of Examples 29-38, wherein the read voltage has a negative polarity and the fourth program pulse has a negative polarity.

Example 43 may include the subject matter of any one of Examples 29-42, wherein a solid state drive comprises the storage device controller and the at least one chip.

Example 44 may include the subject matter of any one of Examples 29-42, wherein a dual in-line memory module comprises the storage device controller and the at least one chip.

Example 45 may include the subject matter of any one of Examples 29-44, further comprising a processor to generate data to be stored by the three dimensional crosspoint memory array, the processor to couple to the at least one memory chip through the storage device controller.

Example 46 may include the subject matter of Example 45, further comprising one or more of: a battery communicatively coupled to the processor, a display communicatively coupled to the processor, or a network interface communicatively coupled to the processor.

What is claimed is:

1. A memory device including:
   a three dimensional crosspoint memory array comprising memory cells each comprising two terminals and a storage element programmable to one of a plurality of program states each representing distinct values for at least two bits; and
   access circuitry to:
   apply a first program pulse with a positive polarity across the two terminals of a first memory cell of the memory cells to program the first memory cell to a first program state of the plurality of program states;
   apply a second program pulse with a negative polarity across the two terminals of the first memory cell to program the first memory cell to a second program state of the plurality of program states; and
   during a read operation, apply a plurality of read voltages having positive polarities and a plurality of read voltages having negative polarities across the two terminals of the first memory cell to determine a program state of the first memory cell.

2. The memory device of claim 1, wherein the first memory cell comprises a first layer of chalcogenide material to function as a selector device and a second layer of chalcogenide material to function as the storage element.

3. The memory device of claim 1, wherein the first memory cell comprises a chalcogenide material to function as both a selector device and the storage element.

4. The memory device of claim 1, wherein the access circuitry is to apply a third program pulse with a negative polarity across the two terminals of the first memory cell to program the first memory cell to a third program state of the plurality of program states;
   wherein the third program pulse has a different amplitude from that of the second program pulse but has the same pulse width as that of the second program pulse.

5. The memory device of claim 1, wherein the access circuitry is to apply a third program pulse with a negative polarity across the two terminals of the first memory cell to program the first memory cell to a third program state of the plurality of program states;
   wherein the third program pulse has the same amplitude as that of the second program pulse but has a different pulse width.

6. The memory device of claim 1, wherein the access circuitry is to apply a third program pulse with a negative polarity across the two terminals of the first memory cell to program the first memory cell to a third program state of the plurality of program states;
   wherein the third program pulse has a different amplitude and a different pulse width from that of the second program pulse.

7. The memory device of claim 1, wherein each of the plurality of states represents a distinct value of three bits, wherein the access circuitry is to program the plurality of program states to the memory cells by varying amplitude, polarity, and pulse width of program pulses applied to the terminals of the memory cells.

8. The memory device of claim 1, wherein the access circuitry is to apply, during the read operation, four read voltages having positive polarities and three read voltages having negative polarities to determine a program state of the first memory cell.

9. The memory device of claim 1, wherein the access circuitry is to apply, during the read operation, a series of read voltages having positive polarities and then a series of read voltages having negative polarities to the terminals of the first memory cell to determine a program state of the first memory cell.

10. The memory device of claim 1, wherein the access circuitry is to apply, to the terminals of the first memory cell, a fourth program pulse having a pulse magnitude, pulse width, and pulse polarity that are substantially similar to a pulse magnitude, pulse width, and pulse polarity of a third program pulse used to program the first memory cell, wherein the fourth program pulse is to refresh the program state of the first memory cell responsive to a determination that a read voltage has caused the first memory cell to undergo a threshold event.

11. The memory device of claim 10, wherein the read voltage has a positive polarity and the fourth program pulse has a positive polarity.

12. The memory device of claim 10, wherein the read voltage has a negative polarity and the fourth program pulse has a negative polarity.

13. The memory device of claim 1, further comprising a plurality of memory chips, wherein a first memory chip comprises the memory array and the access circuitry.

14. The memory device of claim 13, further comprising a memory controller to communicate with the plurality of memory chips.

15. The memory device of claim 1, wherein the memory device comprises a solid state drive.

16. The memory device of claim 1, wherein the memory device comprises a dual in-line memory module.

17. A method comprising:
applying a first program pulse with a positive polarity across two terminals of a first memory cell of a plurality of memory cells of a three dimensional crosspoint memory array to program the first memory cell to a first program state of a plurality of program states, wherein the memory cells each comprise two terminals and a storage element programmable to one of the plurality of program states each representing distinct values for at least two bits;
applying a second program pulse with a negative polarity across the two terminals of the first memory cell to program the first memory cell to a second program state of the plurality of program states; and
during a read operation, applying a plurality of read voltages having positive polarities and a plurality of read voltages having negative polarities across the two terminals of the first memory cell to determine a program state of the first memory cell.

18. The method of claim 17, further comprising applying, in order during the read operation, a first read voltage having a positive polarity, a second read voltage having a negative polarity, a third read voltage having a positive polarity, and a fourth read voltage having a negative polarity to the terminals of the first memory cell to determine that the first memory cell is programmed to the second state.

19. A system comprising:
a storage device controller; and
at least one memory chip coupled to the storage device controller, wherein a memory chip comprises:
a three dimensional crosspoint memory array comprising memory cells each comprising two terminals and a storage element programmable to one of a plurality of program states each representing distinct values for at least two bits; and
access circuitry to:
apply a first program pulse with a positive polarity across the two terminals of a first memory cell of the memory cells to program the first memory cell to a first program state of the plurality of program states;
apply a second program pulse with a negative polarity across the two terminals of the first memory cell to program the first memory cell to a second program state of the plurality of program states; and
during a read operation, apply a plurality of read voltages having positive polarities and a plurality of read voltages having negative polarities across the two terminals of the first memory cell to determine a program state of the first memory cell.

20. The system of claim 19, further comprising a processor to generate data to be stored by the three dimensional crosspoint memory array, the processor to couple to the at least one memory chip through the storage device controller.

21. The system of claim 20, further comprising one or more of: a battery communicatively coupled to the processor, a display communicatively coupled to the processor, or a network interface communicatively coupled to the processor.

\* \* \* \* \*